US010397668B2

(12) United States Patent
Tang et al.

(10) Patent No.: US 10,397,668 B2
(45) Date of Patent: Aug. 27, 2019

(54) WAKEUP SEQUENCE FOR TWO-WIRE DAISY CHAIN COMMUNICATION SYSTEM

(71) Applicants: PANASONIC INTELLECTUAL PROPERTY MANAGEMENT CO., LTD., Osaka (JP); PANASONIC ASIA PACIFIC PTE. LTD., Singapore (SG)

(72) Inventors: Hong Meng Tang, Singapore (SG); Chung Kiong Leslie Khoo, Singapore (SG); Tien Yew Kang, Singapore (SG); Muhammad s/o Abuturab, Singapore (SG); Narciso Repollo Semira, Singapore (SG); Gorou Mori, Osaka (JP)

(73) Assignees: PANASONIC INTELLECTUAL PROPERTY MANAGEMENT CO., LTD., Osaka (JP); PANASONIC ASIA PACIFIC PTE. LTD., Singapore (SG)

( * ) Notice: Subject to any disclaimer, the term of this patent is extended or adjusted under 35 U.S.C. 154(b) by 697 days.

(21) Appl. No.: 14/791,803

(22) Filed: Jul. 6, 2015

(65) Prior Publication Data
US 2017/0010329 A1 Jan. 12, 2017

(51) Int. Cl.
G01R 31/36 (2019.01)
B81B 7/02 (2006.01)
H04Q 9/00 (2006.01)
G01R 31/396 (2019.01)
H01M 10/42 (2006.01)
H01M 10/48 (2006.01)
G01R 31/3835 (2019.01)

(52) U.S. Cl.
CPC ......... H04Q 9/00 (2013.01); G01R 31/3835 (2019.01); G01R 31/396 (2019.01); H01M 10/425 (2013.01); H01M 10/482 (2013.01); H01M 2010/4271 (2013.01); H01M 2010/4278 (2013.01); H04Q 2209/30 (2013.01); H04Q 2209/883 (2013.01)

(58) Field of Classification Search
CPC .................................................. H04Q 2209/30
USPC ......................................................... 702/57
See application file for complete search history.

(56) References Cited

U.S. PATENT DOCUMENTS

| 2003/0093713 | A1* | 5/2003 | Werner | G01R 31/31715 714/25 |
| 2013/0187610 | A1* | 7/2013 | Hayashi | H02J 7/00 320/118 |
| 2015/0151960 | A1* | 6/2015 | McCleland | B81B 7/02 73/865.8 |

* cited by examiner

Primary Examiner — Moazzam Hossain
Assistant Examiner — Omar F Mojaddedi
(74) Attorney, Agent, or Firm — Greenblum & Bernstein, P.L.C.

(57) ABSTRACT

A plurality of batteries connected in series are monitored by a plurality of monitor devices, respectively. The monitor devices are connected in series to communicate under the daisy chain communication system. The daisy chain communication system includes a micro-control unit for producing a binary signal, a communication device for converting the binary signal to a pulsating signal. The communication device produces a special code based on an instructions from the micro-control unit. Each monitor device changes between a communication OFF state and a communication ON state. Each monitor device has a signal detector which operates during the communication OFF state and detects the special code, whereby upon detection of the special code, the signal detector generates a wakeup signal so that the monitor device is changed from the communication OFF state to communication ON state.

16 Claims, 8 Drawing Sheets

WAKEUP SEQUENCE FOR TWO-WIRE DAISY CHAIN COMMUNICATION SYSTEM

BACKGROUND OF THE INVENTION

Recently, an automobile carries a plurality of batteries connected in series. To monitor the batteries, a battery monitoring system is provided.

The battery monitoring system has a plurality of monitor units connected in series so that a control signal from a micro controller unit is sent in a direction from one end of the series connection to the other end, and a response signal from the monitor units are returned in a direction from the other end to the one end. Such a transmission of the signal is called a daisy chain communication system. In a typical daisy chain communication system, devices are inter-connected one after another to allow data or information to be passed down from a master device to each and every slave devices along the daisy chain path. The main advantages of the daisy chain system are its simplicity and scalability. User can simply add more devices, when needed, with ease when designing the system. This advantage has resulted in the daisy chain system being used in several applications. One key application that is popular with the daisy chain system is a battery operated system in particular stack battery system. The automotive industry designing electric vehicle (EV) or hybrid vehicle (HEV) works on the basis of stack Li-ion batteries. In the EV system, the batteries are stacked to generate the required voltage rail to power the vehicle. These stacked batteries will be required to be monitored closely to make sure operation is safe. As such, battery management system that monitors individual battery voltage is designed. A plurality of battery and a plurality of battery monitor modules must communicate with each other, and more importantly communicate with the system micro-controller to report the status of the batteries. To pass data or information to each device, daisy chain method is normally used.

FIG. 1 shows a basic structure of a conventional battery monitoring system. The system shown in FIG. 1 includes the following elements: controller unit 10; a plurality of monitor devices 20 for monitoring a battery; stacked battery 30; and interconnection wire harnesses 40. Monitor device (N) is working on high voltage domain due to the high number of stacked batteries whereas monitor device (1) is working on low voltage domain. To achieve communication platform, interconnect wire harnesses 40 provided with isolation devices are used for connecting all the monitor devices.

FIG. 2A shows an example of one embodiment of a prior art battery management system. To allow monitor device 20 to communicate with the controller unit 10, lower/upper interface ports DataL 21, DataU 22 are provided for data transmission. In additional since the monitor devices are turned ON or turned OFF by the control of MCU 11, input/output interface ports WakeupL 24; WakeupH 25 and ShutdnL 23; ShutdnH 26 are provided so that all monitor devices in the daisy chain communication system are turned ON or OFF by the controller unit 10. The lower/upper interface ports DataL 21, DataU 22, and the input/output interface ports WakeupL 24; WakeupH 25 and ShutdnL 23; ShutdnH 26 are connected via isolation or contactless devices and wire harness 40 in the system. Each interface port requires a pair of wire harness 43 connected between the neighboring monitor devices. Isolation devices, such as the transformer 41 and photo coupler 42, are used. The controller unit 10, includes a MCU 11 coupled with the first monitor device 16, which serves as a master monitor device in the system. The master monitor device 16 translates MCU 11 data information into daisy chain protocol.

In another embodiment of a prior art battery management system shown in FIG. 2B, a communication conversion device COM 12 is connected in between MCU 11 and the first monitor device 20. The COM device 12 is provided to translate MCU 11 data information into daisy chain protocol after receiving the data from serial peripheral interface 15 or wakeup 13; shutdown interface 14 from the MCU. The conversion by the COM device 12 allows all monitor devices 20 to be configured as slave devices and serve as a way of standardization of monitor devices design platform.

According to FIG. 2A or 2B, the prior art battery management system has a number of problems.

First, controller unit 10 has separate control ports for the data transmission and the wakeup/shutdown transmission. Because of the separate controls, the complexity of designing micro-controller interface, in daisy chain system increases.

Second is the high cost incur to provide several external isolation devices 41 and 42 to separate the data transmission control and the wakeup/shutdown control.

Third is the high cost incur to include more wire harness 43 (up to 6 wire harnesses are needed) when the data transmission control and the wakeup/shutdown control are separated.

The present invention solves these problems and provides a cost effective and robust method of waking up and communicating device MCU with all the related monitor devices in the whole bank of daisy chain devices using only two wires of interconnecting harness.

SUMMARY OF THE INVENTION

The purpose of this invention is to provide a cost effective and robust way of communicating daisy chain devices using two-wire interfaces.

According to the preferred embodiment of the invention, a daisy chain communication system comprises: a micro-control unit that produces a binary signal; a communication device that converts the binary signal to a pulsating signal which is capable of being communicated through a two-wire communication channel, said communication device relaying a special code sent by the micro-control unit; and a plurality of monitor devices connected in series using the two-wire communication channel between the neighboring two monitor devices and between a first monitor device and the communication device. Each monitor device is configured to change between a communication OFF state in which an electric power is not supplied and a communication ON state in which the electric power is supplied. Each monitor device comprises a signal detector which operates during the communication OFF state and detects the special code, whereby upon detection of the special code, the signal detector generates a wakeup signal so that the monitor device is changed from the communication OFF state to communication ON state.

According to a preferred embodiment of the above described daisy chain communication system, each monitor device further comprises: a lower transceiver connected to one end of the two-wire communication channel; and an upper transceiver connected to an other end of the two-wire communication channel.

According to a preferred embodiment of the above described daisy chain communication system, each monitor device further comprises: a communication logic for enabling its communication channel upon receipt of the wakeup signal.

According to a preferred embodiment of the above described daisy chain communication system, the two-wire communication channel comprises two parallel lines.

According to a preferred embodiment of the above described daisy chain communication system, the two-wire communication channel comprises two parallel lines and an isolation element inserted in the two parallel lines.

According to a preferred embodiment of the above described daisy chain communication system, the isolation element is a transformer.

According to a preferred embodiment of the above described daisy chain communication system, the isolation element is a capacitive device.

According to a preferred embodiment of the above described daisy chain communication system, the signal detector comprises a pulse edge detector which detects the edges of the pulsating signal, and a counter for counting the number of edges detected by the pulse edge detector.

According to a preferred embodiment of the above described daisy chain communication system, the signal detector comprises a voltage regulator.

According to a preferred embodiment of the above described daisy chain communication system, the wakeup signal wakes up the communication logic from shutdown mode, re-enable its communication channel or reset the device from a fault mode.

According to a preferred embodiment of the invention, a daisy chain communication method comprises: producing, by a micro-control unit, a binary signal; converting, by a communication device, the binary signal to a pulsating signal which is capable of being communicated through a two-wire communication channel; relaying, by said communication device, a special code sent by the micro-control unit, to a first monitor device of a plurality of monitor devices connected in series; detecting, by a signal detector provided in a first monitor device, the special code from the communication device; producing, by the signal detector, a wakeup signal for changing the first monitor device from a communication OFF state to a communication ON state; sending, by the said communication device, to the first monitor device the special code for a second time; receiving, by the first monitor device which is in a communication ON state, the special code for the second time from the communication device; relaying, by the first monitor device, the special code received from the communication device, to a second monitor device, and sending a feedback to the communication device; detecting, by a signal detector provided in the second monitor device of the plurality of monitor devices connected in series, the special code from the first monitor device; producing, by the signal detector, a wakeup signal for changing the second monitor device from a communication OFF state to a communication ON state; sending, by the first monitor device, the special code to the second monitor device for a second time; receiving, by the second monitor device which is in a communication ON state, the special code for the second time from the first monitor device; and relaying, by the second monitor device, the special code received from the first monitor device, to a third monitor device, and sending a feedback to the second monitor device.

It will be recognized that some or all of the Figures are block level representations for purposes of illustration and do not necessarily depict the actual relative sizes or locations of the elements shown.

DETAILED DESCRIPTION OF THE PREFERRED EMBODIMENTS

Figure 1:
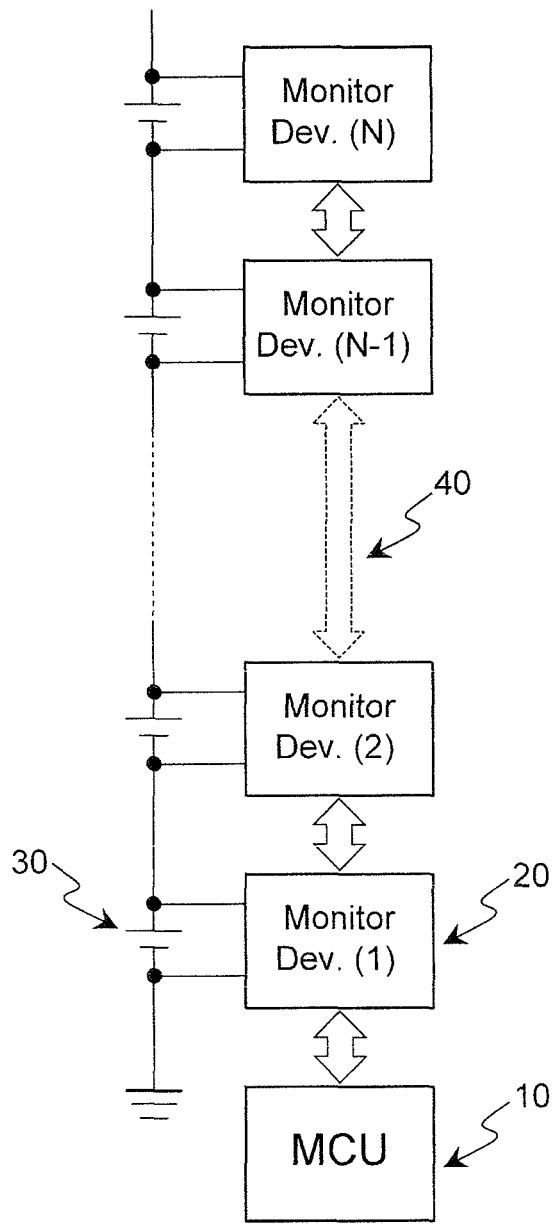
FIG. 1 shows a conventional battery monitoring system block diagram.
Figure 2A:
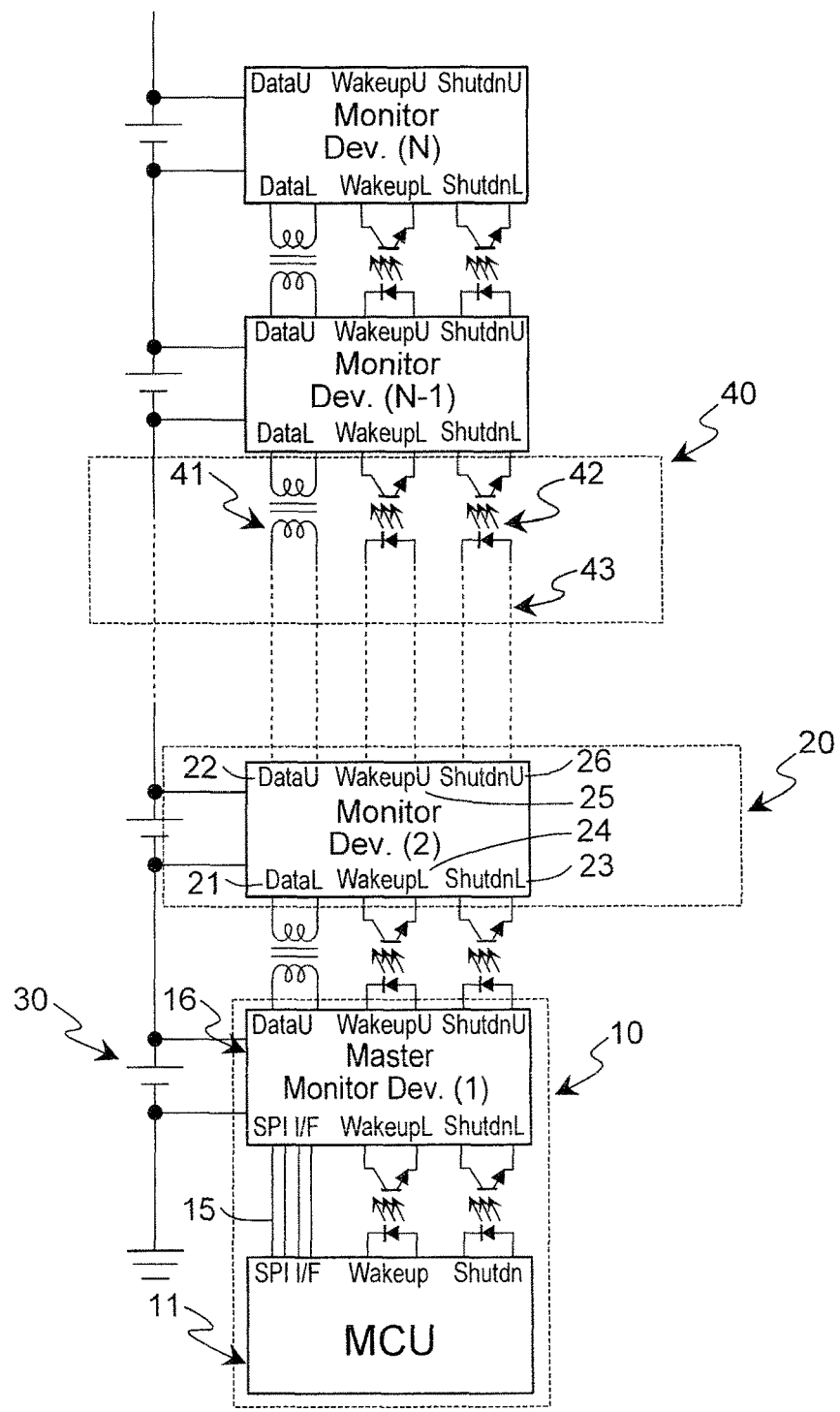
FIG. 2A shows an elaborated description of a typical battery monitoring system according to the prior art.
Figure 2B:
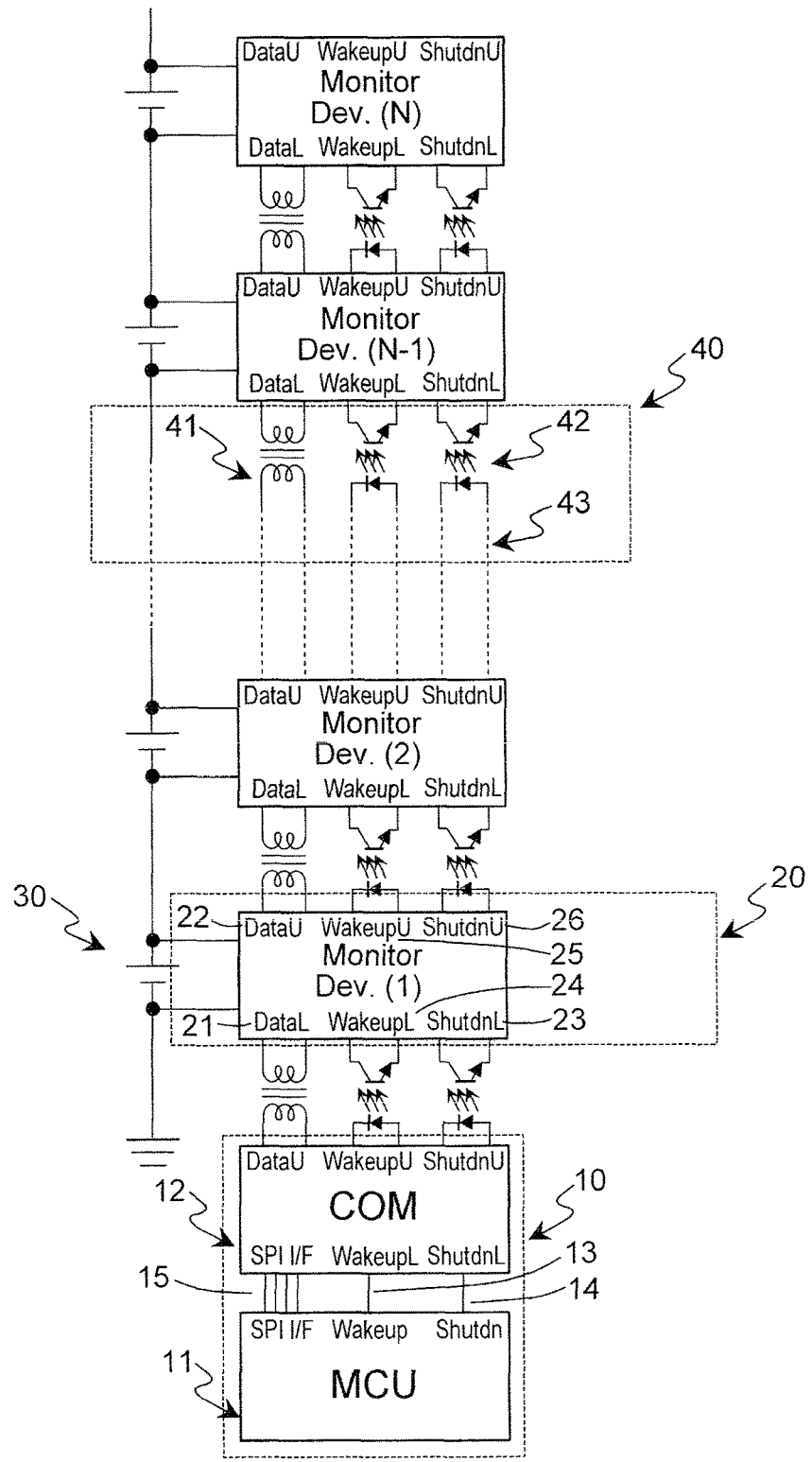
FIG. 2B shows another elaborated description of a typical battery monitoring system according to the prior art.
Figure 3A:
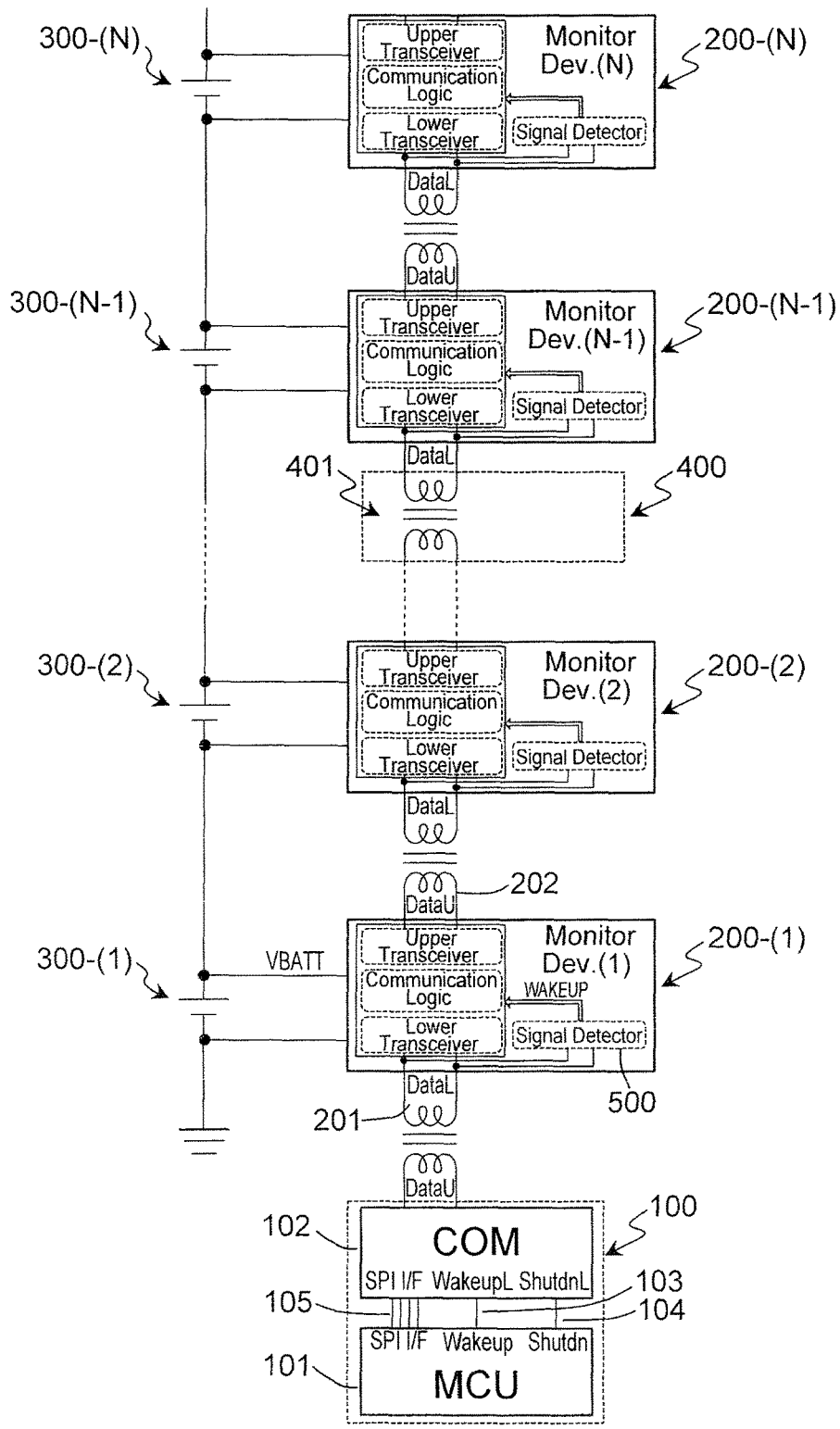
FIG. 3A shows a first embodiment of a battery monitoring system with two wires wakeup implementation.
Figure 3B:
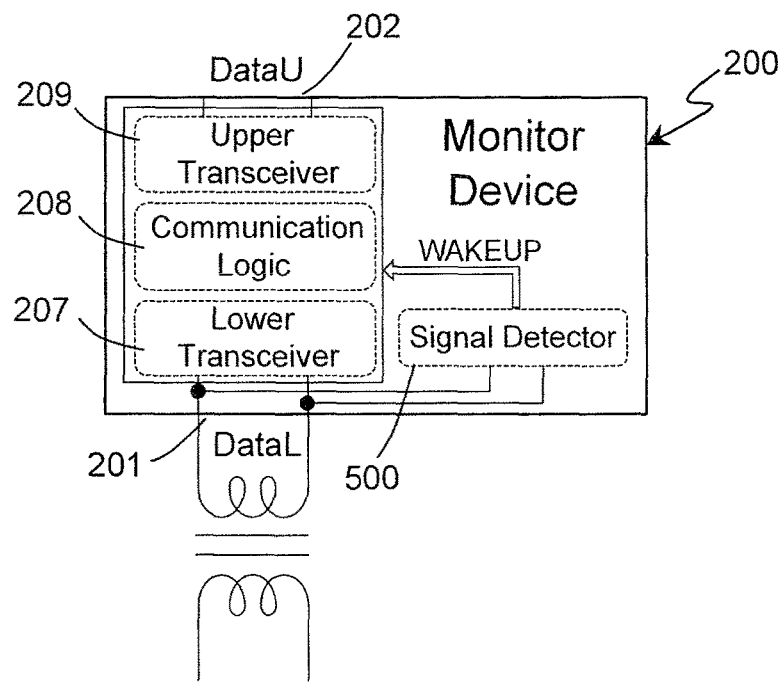
FIG. 3B shows a detailed circuit diagram of a monitor device used in the battery monitoring system shown in FIG. 3A.
Figure 3C:
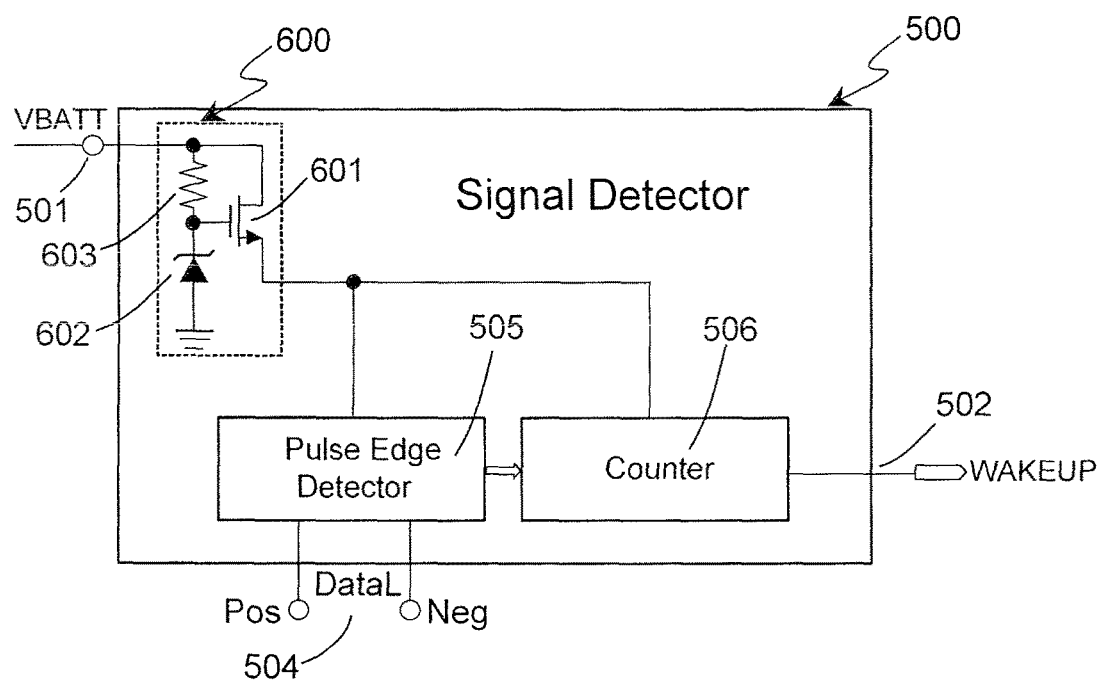
FIG. 3C shows a detailed circuit diagram of a signal detector used in the battery monitoring system shown in FIG. 3A.

FIGS. 3A, 3B and 3C show a first embodiment of the battery monitoring system.

FIG. 3A shows an over-all embodiment of a battery monitoring system with two wires wakeup implementation.

The battery monitoring system includes the following elements: controller unit 100; one or a plurality of monitor devices 200 for monitoring a battery; one or a plurality of batteries 300; and one or a plurality of two wires interconnection harnesses 400 which includes a transformer 401. Here, the "two wires" means two wires extending from one side of the transformer 401, and two wires extending from the other side of the transformer 401. Accordingly, the connection between the two neighboring monitor devices, such as 200-(1) and 200-(2), can be accomplished by connecting the pair of output terminals in monitor device 200-(1) with the pair of input terminals in monitor device 200-(2) with a transformer 401 inserted there between.

The controller unit 100 includes a micro-control unit (MCU) 101 and a communication device (COM) 102. MCU 101 and COM 102 are provided as an example, and they can be replaced with some other elements. COM 102 converts a binary signal supplied from MCU 101 through an interface 105, such as SPI interface, into a pulsating signal to be supplied to two-wire daisy chain communication system comprising a series connection of monitor devices 200-(1) to 200-(N), N being a positive integer greater than one. The pulsating signal is formed by a rising edge and a falling edge with a varying interval or a varying pulse duration between the edges. A pulse duration between the rising and falling edges, or between the falling and rising edges, is selected to be one of 2T, 3T and 4T (T is a predetermined unit time). When the pulse duration is 2T, the pulsating signal carries the binary information of "00", when the pulse duration is 3T, the pulsating signal carries the binary information of "01", and when the pulse duration is 4T, the pulsating signal carries the binary information of "10". This is one example of converting the binary signal to pulsating signal, or vice versa. Other method can be used. The wakeup 103 and shutdown 104 signal interface between the MCU 101 and COM 102 are exemplary interface as shown in FIG. 3A. These signal interfaces provide a hard wired connection between the two devices and it is possible to be replaced by register control through the SPI interface 105. The two-wire interface provides a robust differential pair communication channel in a battery monitoring system. Here, the two-wire interface means two wires Pos and Neg shown in FIG. 3C or 4C, used for transmitting binary signal at interface port DataL. Here, the robust differential pair communication channel means a communication using a rising edge from low to high level and a falling edge from high to low level, so that the communication channel uses only two levels, i.e., a low level and a high level appearing between two wires Pos and Neg. The detection of low level and high level is robust and is strong with respect to noises.

Referring to FIG. 3B, each monitor device 200 includes a lower interface port 201 (input pair of terminals) and an upper interface port 202 (output pair of terminals), each port configured to receive two-wire connection. This allows each monitor device to communicate with the upper side or lower side monitor device easily with simple connection. Each monitor device 200 is connected to a corresponding battery 300, and has a voltage monitor unit (not shown) for monitoring the voltage across the battery 300. The monitored voltage of the battery is applied to a communication logic 208 which sends the monitored voltage to MCU 101. Batteries are stacked on top of each other. In the example shown in FIG. 3A, battery, such as 300-(1), includes only one battery cell which is connected to one monitor device 200-(1). It is possible that each battery, such as 300-(1), includes a plurality of battery cells, such as twenty battery cells, and each battery cell producing a predetermined voltage, such as 3.7 volts. Hence, each battery generates 74 volts. Each monitor device operates under a different voltage domain or range. Monitor device 200-(2) operates at one battery voltage higher than monitor device 200-(1). For example, when one battery produces a voltage Vp, the first monitor device 200-(1) operates under the voltage range of 0-Vp, and the second monitor device 200-(2) operates under the voltage range of Vp-2Vp, and so on. Therefore, there will be a potential difference of Vp in the operation range between the neighboring two monitor devices. Each monitor device needs some form of a potential level shifter or an isolator between the upper side monitor device and the lower side monitor device. For this purpose, the transformer 401 is provided. The example shown in FIG. 3A uses a two-wire interconnection harness 400 that includes transformer 401 which provides the necessary direct voltage de-coupling between the neighboring devices.

Each of the monitor devices 200-(1) to 200-(N) is either in a communication ON state (enabled state) or in a communication OFF state (disabled state) by the control of MCU 101. When the monitor device is in the communication OFF state, basically no electric power is supplied to the monitor device for power saving. When the monitor device has to be changed from the communication OFF state to the communication ON state, a wakeup signal is applied to that monitor device to carry out a wakeup procedure, so that electric power is again supplied to that monitor device. The change from the communication ON state to the communication OFF state, or vice versa, will be explained later in connection with FIG. 3C.

The battery monitoring system operates in such a way that, when all the monitor devices 200-(1) to 200-(N) are in the communication ON state, the data sent from MCU 101 through COM 102 is applied to monitor device 200-(1), and serially transmitted to the next upper monitor device until the last monitor device 200-(N) receives the data. The transmission of the date from MCU 101 toward monitor device 200-(N) is called an up-stream transmission. Conversely, the transmission of the data from monitor device 200-(N) toward MCU 101 is called a down-stream transmission. In this manner, the MCU 101 sends instructions to each of monitor devices, such as instructions to collect the battery voltage information from each of the monitor devices, and the monitor devices sequentially send the battery voltage information, together with the assigned address, to the MCU 101. MCU 101 may send instructions only to a selected monitor device by using a unique address assigned to that selected monitor device. The example shown in FIG. 3A is also applicable to battery monitoring system with addressing. Each of the monitor devices 200 in the battery monitoring system is assigned with a unique address after each establishment of the communication ON state. Once the communication ON state is changed to communication OFF state, the assigned addresses are reset. It is possible, in some example, to keep the originally assigned addresses until they are forcibly reset. The unique address allows the MCU 101 to communicate with a target monitor device 200 individually.

Each of the monitor devices receives its power from the corresponding connected battery 300. From the viewpoint of power saving, the battery monitoring system is configured to put each monitor device 200 to shut down or communication OFF state. When one monitor device 200 in the daisy chain is shutdown, or its communication channel is disabled, the data flow is blocked by that monitor device. The MCU 101 cannot communicate with any of the monitor devices 200 beyond the shutdown monitor device, or the monitor device whose communication channel is disabled. In such a case, it is necessary for the MCU 101 to reset the monitor devices 200 into a known state which is a communication ON state. In a battery monitoring system with addressing, it is necessary to re-assign the address for each monitor device 200 after the communication ON state is established.

FIG. 3A shows monitor devices each including a signal detector 500 for waking up the system through the two-wire communication channel. Each of the monitor devices 200 includes the signal detector 500 that allows the battery monitoring system to wake up by monitoring the two-wire daisy chain communication system. The signal detector 500 shown in FIG. 3A can also be used to re-enable the communication channel after it is being disabled. The signal detector 500 can be used not only to wake up and re-enabling of communication channel, but also to any form of operating mode change in a battery monitoring system.

FIG. 3B shows an enlarged scale of one monitor device 200 with two wires wakeup implementation.

The monitor device 200 includes the following elements: a lower transceiver 207; a communication logic 208; an upper transceiver 209; and a signal detector 500.

The lower transceiver 207 allows the monitor device to communicate with the lower side monitor device through the lower interface port (DataL) 201 by pulsating signal transmitted through the isolation device such as a transformer 401. Instead of transformer, a photo coupler or a capacitive device may be used. The upper transceiver 209 allows the monitor device to communicate with the upper side monitor device through the upper interface port (DataU) 202 by pulsating signal transmitted through the isolation transformer 401. The communication logic 208 is provided to serve three functions, which are to convert the pulsating signal to binary signal, to control and process the flow of information between the up-stream transmission and down-stream transmission, and to convert the binary signal to the pulsating signal.

Referring to FIG. 3C, the signal detector 500 monitors the lower interface port (DataL) 201 and detects a predetermined data of a special code during the shutdown period, i.e., the communication OFF status. The predetermined data of special code is a consecutive 15 pulses, for example. The special code in the binary signal is generated by the MCU 101, and special code in the binary signal is converted to the special code in pulsating signal in COM 102. Alternatively, the MCU generates an instruction to produce a special code, and COM 102 generates the special code in pulsating signal in response to the instruction. In either case, COM 102 generates the special code based on instructions from MCU 101. When the special code is detected, the signal detector 500 sends a wakeup signal to all the elements provided in the monitor device to power up the monitor device from the shutdown state.

When the monitor device is in a shutdown state (communication OFF state), all the elements in the monitor device, other than the signal detector 500, particularly a pulse edge detector 505, are disabled. The signal detector 500 received power directly from battery 300, or may be designed to be a self-powered by a separate power source. Under this condition, the MCU 101 sends the special code (15 consecutive pulses) to the two-wire daisy chain communication channel through the COM 102. The monitor device 200 that is in the communication OFF state receives the special code by the signal detector 500 through lower interface port (DataL) 201. When the signal detector 500 detects the special code, the monitor device 200 receives power from the battery 300 and changes its state from the communication OFF state to communication ON state, so that the communication through the communication channel will be enabled. When the monitor device establishes the communication ON state, monitor device 200 receives the special code for the second time from the COM 102, or from the previous monitor device 200, to activate all the elements in monitor device 200. In other words, monitor device 200 receives the special code for the first time for the wakeup purpose, i.e., to supply electric power to all the elements in monitor device 200, and consecutively receives the special code for the second time for activating all the elements in monitor device 200. Thus, monitor device 200 receives the special code twice, the first special code to establish the communication ON state and the second special code to activate all the elements in the monitor device 200.

Therefore, when the monitor device 200 receives the special code for the first time, the communication ON state is established, so that the monitor device 200 can now receive and recognize the special code for the second time. When the monitor device 200 receives the special code for the second time, the monitor device 200 relays the special code to the next upper side monitor device and also sends a feedback to the COM 102, or to the previous monitor device. The relay continues until all the monitor devices 200 in the battery monitoring system are woke up and activated. The COM 102 or the previous monitor device 200 continues to send the special code for the second time to the monitor device 200 repeatedly until the COM 102 or the previous monitor device 200 receives the feedback from the monitor device 200. This feedback is used by the previous monitor device 200 to indicate the success of data transmission from the previous monitor device to the present monitor device. This feedback will not be transmitted at all, when the monitor device 200 is in communication OFF state.

FIG. 3C shows an example of a signal detector 500.

Signal detector 500 includes the following elements: a battery input 501, a wakeup signal output 502, a two wire-data monitoring input 504, a low current voltage regulator 600, a pulse edge detector 505 and a counter 506.

The signal detector 500 operates during communication OFF state. An example of a low current voltage regulator 600 includes a transistor 601, a zener diode 602 and a resistor 603. The voltage regulator 600 receives a high voltage VBATT from the battery 300 and provides a low voltage to the pulse edge detector 505 and a counter 506.

The wakeup procedure is as follows. When the pulse edge detector 505 receives the special code (15 consecutive pulses) at its two-wire data monitoring input 504, the counter 506 counts the number of pulses in the special code. When the counter 506 counts a pre-determined count, such as 15, corresponding to the number of pulses in the special code, the wakeup signal is produced from output 502. Instead of the counter 506, a pattern matching unit may be used. In this case, the special code has a predetermined special pattern.

The wakeup signal is applied to lower transceiver 207, communication logic 208 and upper transceiver 209, and other units, such as the voltage monitor unit, in the monitor device. Accordingly, the monitor device 200 is changed from the communication OFF state to communication ON state, ready to receive the special code for the second time. Upon receipt of the special code for the second time, the monitor device 200 is activated to receive specific instructions from MCU 101. After necessary communications between the MCU 101 and the monitor devices 200 are completed, MCU 101 sends shutdown signal to monitor devices 200. Upon receipt of the shutdown signal, the monitor device 200 is changed from communication ON state to communication OFF state. The monitor device 200 may automatically change from communication ON state to communication OFF state, if no signal is received from the MCU 101 for a predetermined period of time.

The battery monitoring system shown in FIG. 3A, FIG. 3B and FIG. 3C is not limited to wake up, but also to re-enable the communication channel, and to any other form of operating mode change in response to a special code sent by the micro controller unit (MCU) 101.

Figure 4A:
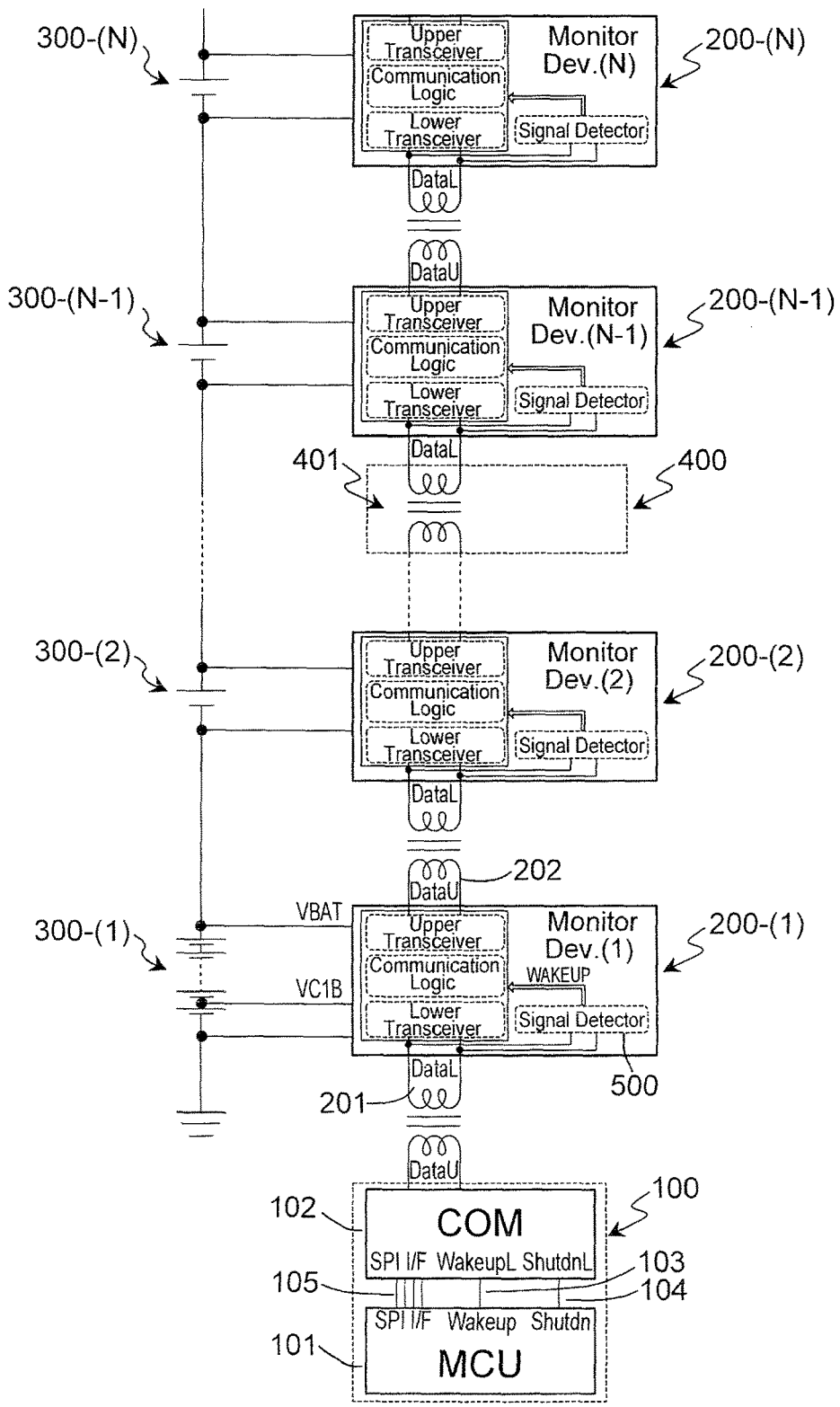
FIG. 4A shows a second embodiment of a battery monitoring system with two wires wakeup implementation.
Figure 4B:
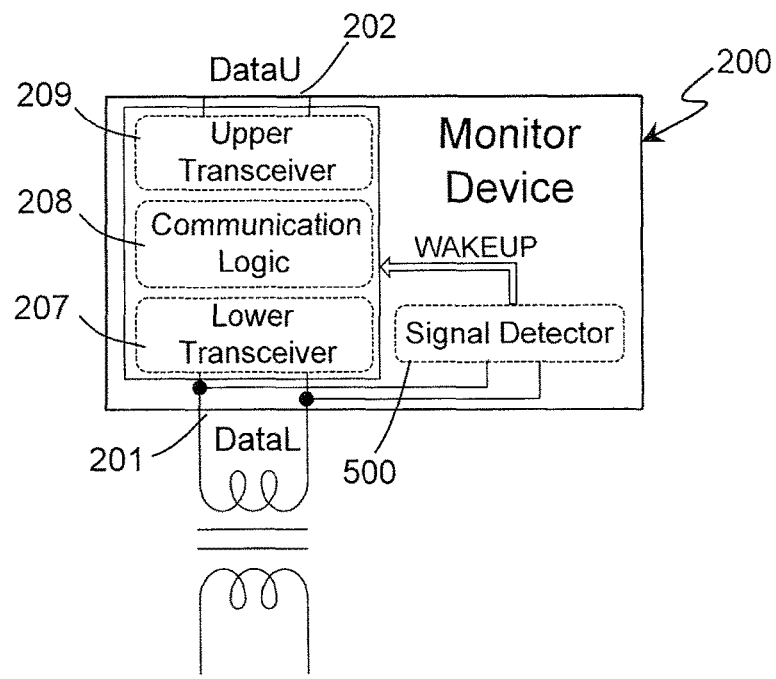
FIG. 4B shows a detailed circuit diagram of a monitor device used in the battery monitoring system shown in FIG. 4A.
Figure 4C:
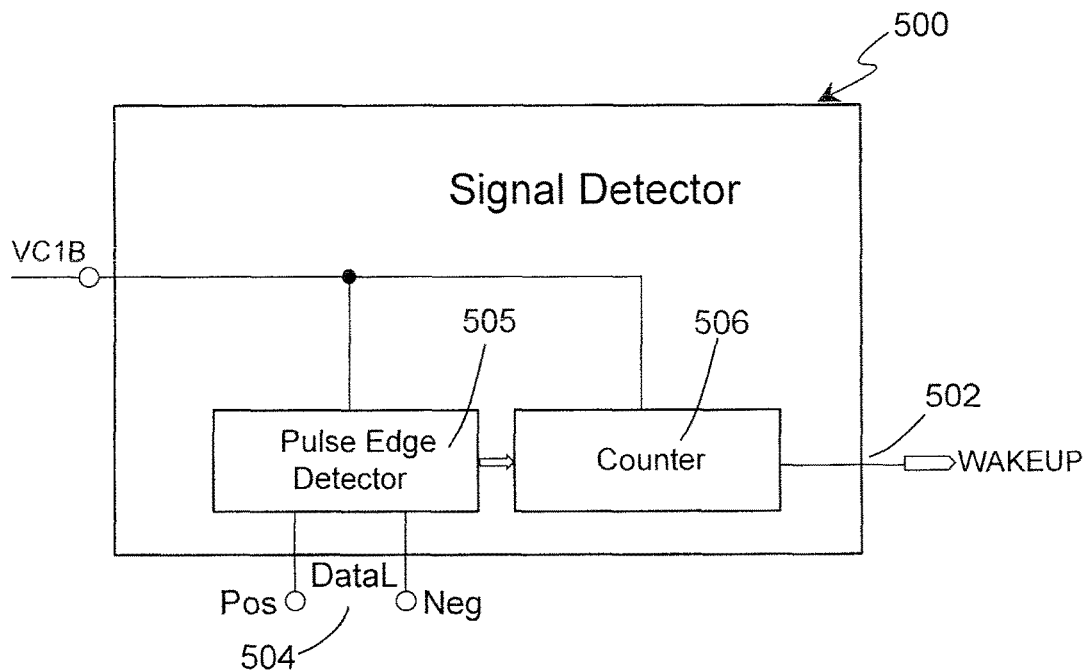
FIG. 4C shows a detailed circuit diagram of a signal detector used in the battery monitoring system shown in FIG. 4A.

Referring to FIGS. 4A, 4B and 4C, a second embodiment of the battery monitoring system is shown. In comparison with the first embodiment, the second embodiment has no low current voltage regulator 600. Instead, a voltage VC1B from one or a few battery cells from the stack of battery cells is taken out and applied to the signal detector 500. Voltage VC1B is the required voltage for operating the signal detector 500.

According to a modification which can be applied to the first and second embodiments, it is possible to omit the use of transformer 401 between the neighboring monitor devices, such as 200-(1) and 200-(2). In this case, the pair of output terminals in monitor device 200-(1) are connected directly to the pair of input terminals in monitor device 200-(2).

Figure 5:
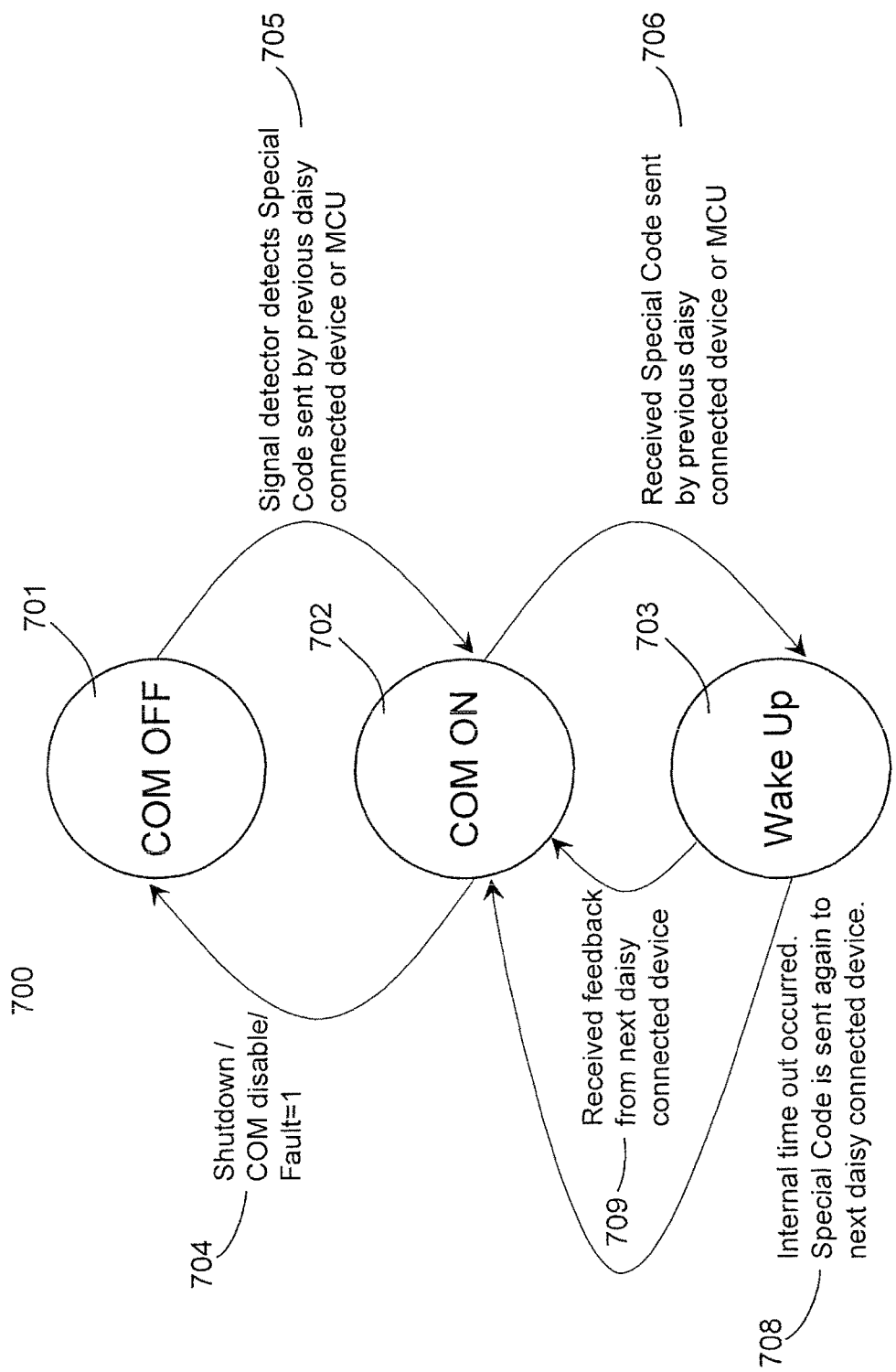
FIG. 5 shows a state diagram illustrating the transition of various states of the monitor device according to the present invention.

FIG. 5 shows a state diagram illustrating the novel method of waking up any two-wire daisy communication system.

The novel method shows the transition between 3 different states for each device 200.

The communication OFF state (COM OFF) 701 is a state whereby the monitor device 200 is in a disabled condition, because of a shutdown. This condition is transformed from communication ON state, and under this condition, communication is disabled or a fault condition had occurred 704. The monitor device is shutdown so that its communication channel is disabled. This condition is accomplished by the command of the MCU 101, so as to reduce the power consumption of the system during idling or low power operating mode. In the event that the monitor device 200 encounters a fault, such as by a noise signal, the communication channel may also be disabled, so that the two-wire daisy communication of the system is not functional.

The communication ON state (COM ON) 702 is a state whereby the communication channel of the monitor device 200 is fully functional and the MCU 101 is able to communicate with the monitor device 200. This state is set up as the default state after initial power on or after the monitor device 200 recovers from the communication OFF state 701. When the monitor device 200 is in the communication OFF state 701, the monitor device 200 changes to communication ON state 702 after the signal detector 500 in that monitor device 200 detects the special code 705 sent from the MCU 101 or sent from the previous monitor device 200 in the daisy chain communication system.

When the monitor device 200 receives a special code 706 during communication ON state, the monitor device 200 enters a wakeup state 703. In wakeup state 703, the monitor device 200 attempts to wakeup the next monitor device connected in the daisy chain communication system by relaying the same special code to the next monitor device 200. The monitor device 200, which is in the communication ON state, also sends a feedback signal to the previous monitor device connected in the daisy communication system or sends an indication signal to indicate that the communication channel in that monitor device 200 has been enabled. If the monitor device 200 is in the communication OFF state, no feedback signal will be sent to the previous monitor device. When the monitor device 200 is in wakeup state 703, the monitor device 200 receives a feedback signal from the next daisy Chain device 709, it will return back to communication on state (COM ON) 702. If an internal time out period is reached before the feedback is received, it will relay the special code to the next daisy connected device one more time 708. This novel method ensures that the next daisy connected device will eventually read the second transmission of special code if it has just woke up from shutdown state and its communication channel has just been enabled. In other words, the monitor device 200-(1) (or the previous monitor device) sends the special code for the first time to reset the next monitor device 200-(2) and to initialize the communication logic 208. Thus, the monitor device 200-(2) is initialized by the first special code. Then, after a predetermined period of time, the monitor device 200-(1) will send the special code for the second time and will to receive acknowledge from the next monitor device 200-(2).

According to the present invention, when the device is in initial OFF state, the signal detector 500 will detect the special code pulse sent by MCU and COM device. The signal detector 500 in the monitoring device will cause the monitoring device to be turned ON. Since the prior device COM did not receive a feedback from the first monitoring device, it will send out the special code for a second time. Upon receiving the special code for a second time, the monitoring device will recognize this special code and output the same special code to the next device. After which the monitoring device will send out a feedback to the preceding COM device to signal it has received the special code correctly. At this point of time this monitoring device will reset all its memory or register setting to default state and wait for the proper data command to be transmitted as it completes its wakeup sequence. This process will continue till the last monitoring device receives the special code and feedback is sent to the MCU.

According to the present invention, during the case of monitoring, if the monitor device is in initial ON state, the special code is received for the first time from MCU and COM device, the monitor device will be able to recognize the special code instantly. This action will result in the monitor device sending the same special code to the next monitoring device and after which sending back a feedback signal to the preceding monitoring device without waiting for another special code. In this case, the signal detector 500 inside the monitoring device is not used. The same process will continue to the last monitoring device if all devices are in initial ON state. Eventually, all monitor devices will get turn ON with initial memory or register setting reset to default condition and getting ready to receive the next data transmission from MCU and COM devices.

Using above describe invention all memory devices in the daisy chain can be turned ON simply by one single command from the MCU. This reduces the complexity of MCU having to address all the daisy chain monitoring devices individually during waking up. At the same time, this robust wakeup sequence is achieved using the described method by only two-wire harness which is shared between generating wakeup sequence as well as normal data transmission. Last of all only minimum number of external isolation devices between the input/output ports interfaces are used thus saving system cost greatly.

Since each monitor device has the ability to send the special code 2 times if there is no feedback from the next daisy connected device, all the monitor devices 200 will eventually be in communication ON state 702. This method also allows the MCU 101, to send the special code only 2 times and wait for a delay of Nd (d is a delay time observed in one monitor device) to allow time for all the N monitor devices 200 to enter a common known state, which is a communication ON state. If the first monitor device 200 in the daisy connected system can be woken up by a separate pin, such as signal interface pin 103 or 105, connected to the MCU 101, then the MCU 101 will only be required to send the special code once. The special code is sent for a predetermined number of times, which is 2 times in the above example. The predetermined number can be any number other than 2. Alternatively, the special code can be sent repeatedly until the next monitor device 200 wakes up or sends the feedback.

By applying the method of operation as shown in FIG. 5 to N monitor devices connected in a daisy communication system, the first monitor device will be woken up by the MCU 101. The second monitor device will be woken up by the first monitor device in the daisy communication system. This operation will be automatically repeated for each monitor device until the last (Nth) monitor device is woken up. Since each device incurs a single wakeup delay d, the MCU 101 needs to wait for N devices delay after the last special code is sent. At the end of Nd delays, the MCU 101 could perform an address assignment or a broadcast of read and check if all the devices are in operational mode with its communication channel enabled.

Although the embodiment described above is directed to the daisy chain communication system used in a monitoring system for monitoring the batteries provided in an automobile, the daisy chain communication system can be used in a various monitoring systems.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

The invention claimed is:

1. A daisy chain communication system, comprising:
a microcontroller that produces a binary signal;
a communication device that converts the binary signal to a pulsating signal that is communicated through a two-wire communication channel, the communication device relaying a special code sent by the microcontroller, to a first monitor device; and
a plurality of monitor devices connected in series using the two-wire communication channel between neighboring two monitor devices and between a first monitor device and the communication device,
each monitor device configured to change between a communication OFF state in which an electric power is not supplied and a communication ON state in which the electric power is supplied, and
each monitor device including a signal detector that operates during the communication OFF state and detects the special code, whereby upon detection of the special code, the signal detector generates a wakeup signal so that the monitor device is changed from the communication OFF state to communication ON state,
wherein the two-wire communication channel between the neighboring two monitor devices, and between the first monitor device and the communication device, is configured with a first set of two wires extending from a first side of an isolation element and a second set of two wires extending from a second side of the isolation element, such that all communication between the neighboring two monitor devices, and between the first monitor device and the communication device, is conducted by transmitting the pulsating signal through the first set of two wires, the second set of two wires, and the isolation element.

2. The daisy chain communication system of claim 1, each monitor device further comprising:
a lower transceiver connected to one end of the two-wire communication channel; and
an upper transceiver connected to an other end of the two-wire communication channel.

3. The daisy chain communication system of claim 2, each monitor device further comprising:
a communication logic for re-enabling its communication channel upon receipt of the wakeup signal.

4. The daisy chain communication system of claim 1, wherein the isolation element is a capacitive device.

5. The daisy chain communication system of claim 1, wherein the signal detector includes a pulse edge detector that detects edges of the pulsating signal, and a counter for counting a number of edges detected by the pulse edge detector.

6. The daisy chain communication system of claim 1, wherein the signal detector includes a voltage regulator.

7. The daisy chain communication system of claim 3, wherein the wakeup signal wakes up the communication logic from a shutdown mode, re-enables a communication channel of the communication logic, or resets the monitor device from a fault mode.

8. A daisy chain communication method, comprising:
producing, by a microcontroller, a binary signal;
converting, by a communication device, the binary signal to a pulsating signal that is communicated through a two-wire communication channel;
relaying, by said communication device, a special code sent by the microcontroller, to a first monitor device of a plurality of monitor devices connected in series;
detecting, by a signal detector provided in a first monitor device, the special code from the communication device;
producing, by the signal detector, a wakeup signal for changing the first monitor device from a communication OFF state to a communication ON state;
sending, by the communication device, to the first monitor device the special code for a second time;
receiving, by the first monitor device, which is in a communication ON state, the special code for the second time from the communication device;
relaying, by the first monitor device, the special code received from the communication device, to a second monitor device, and sending a feedback to the communication device;
detecting, by a signal detector provided in the second monitor device of the plurality of monitor devices connected in series, the special code from the first monitor device;
producing, by the signal detector, a wakeup signal for changing the second monitor device from a communication OFF state to a communication ON state;
sending, by the first monitor device, the special code to the second monitor device for a second time;
receiving, by the second monitor device, which is in a communication ON state, the special code for the second time from the first monitor device; and
relaying, by the second monitor device, the special code received from the first monitor device, to a third monitor device, and sending a feedback to the first monitor device,
wherein the two-wire communication channel between two neighboring monitor devices, and between the first monitor device and the communication device, is configured with a first set of two wires extending from a first side of an isolation element and a second set of two wires extending from a second side of the isolation element, such that all communication between the neighboring two monitor devices, and between the first monitor device and the communication device, is conducted by transmitting the pulsating signal through the first set of two wires, the second set of two wires, and the isolation element.

9. The daisy chain communication method of claim 8, wherein the sending, by the communication device, to the first monitor device or the sending by any monitor device to the next monitor device, the special code for a second time is repeated for a predetermined number of times when there is no feedback received.

10. The daisy chain communication method of claim 8, wherein the sending, by the communication device, to the first monitor device or the sending by any monitor device to the next monitor device, the special code for a second time is repeated until the communication device receives the feedback from the first monitor device.

11. The daisy communication method of claim 8, further comprising:
detecting, by a signal detector provided in the (N+1)th (N being an integer equal to or greater than 2) monitor device of the plurality of monitor devices connected in series, the special code from the Nth monitor device;

producing, by the signal detector, a wakeup signal for changing the (N+1)th monitor device from a communication OFF state to a communication ON state;

sending, by the Nth monitor device, the special code to the (N+1)th monitor device for a second time;

receiving, by the (N+1)th monitor device which is in a communication ON state, the special code for the second time from the Nth monitor device; and relaying, by the (N+1)th monitor device, the special code received from the Nth monitor device, to a (N+2)th monitor device, and sending a feedback to the Nth monitor device.

12. The daisy chain communication system of claim 1, wherein the isolation element is a transformer.

13. The daisy chain communication system of claim 1, wherein the isolation element is a photo coupler.

14. The daisy communication method of claim 8, wherein the isolation element is a transformer.

15. The daisy communication method of claim 8, wherein the isolation element is a capacitance device.

16. The daisy communication method of claim 8, wherein the isolation element is a photo coupler.

* * * * *